US008622276B2

(12) United States Patent
Takahashi

(10) Patent No.: US 8,622,276 B2
(45) Date of Patent: Jan. 7, 2014

(54) ASSEMBLY JIG FOR A SEMICONDUCTOR DEVICE AND ASSEMBLY METHOD FOR A SEMICONDUCTOR DEVICE

(75) Inventor: Hideaki Takahashi, Omachi (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/367,428

(22) Filed: Feb. 7, 2012

(65) Prior Publication Data

US 2012/0202322 A1   Aug. 9, 2012

(30) Foreign Application Priority Data

Feb. 8, 2011   (JP) .................................. 2011-024611

(51) Int. Cl.
*B23K 1/00*   (2006.01)
(52) U.S. Cl.
USPC ....... 228/6.2; 228/44.7; 228/49.5; 228/180.1; 228/212; 269/303; 269/304
(58) Field of Classification Search
None
See application file for complete search history.

(56) References Cited

U.S. PATENT DOCUMENTS

2009/0275174 A1*   11/2009   Kimbara ....................... 438/121

FOREIGN PATENT DOCUMENTS

| JP | 2007-194477 A | 8/2007 |
| JP | 2008-270262 A | 11/2008 |
| JP | 2010-040881 A | 2/2010 |

* cited by examiner

*Primary Examiner* — Julio J Maldonado
*Assistant Examiner* — Joseph Galvin, III
(74) *Attorney, Agent, or Firm* — Rossi, Kimms & McDowell LLP

(57) ABSTRACT

In aspects of the assembly jig and method of the invention, when a packaging substrate is curved concaving upward at temperatures of melting solder, the gap between the assembly jig and the packaging substrate can be made smaller than the dimension of the sum of the thickness of the semiconductor chip and the thickness of the melted solder by allowing a part of the bottom surface of the chip positioning piece to become always, or substantially always, in contact with the upper surface of the packaging substrate owing to the weight of the chip positioning jig itself. As a consequence, the semiconductor chip does not slip aside out of the opening of the chip positioning piece. Therefore, the semiconductor chip can be positioned accurately on the packaging substrate.

5 Claims, 17 Drawing Sheets

ASSEMBLY JIG FOR A SEMICONDUCTOR DEVICE AND ASSEMBLY METHOD FOR A SEMICONDUCTOR DEVICE

BACKGROUND OF THE INVENTION

1. Field of the Invention

Embodiments of the invention relate to assembly jigs and assembly methods for semiconductor devices, such as semiconductor modules.

2. Description of the Related Art

FIG. 12 is a schematic sectional view of a semiconductor module. This semiconductor module includes a packaging substrate 53 fixed on a cooling base 51 with solidified solder 52, semiconductor chips 55 fixed on the packaging substrate 53 with solidified solder 54, bonding wires 56 in connection with the semiconductor chips 55, a resin casing 58 having lead out terminals 57 attached thereon, and a filling material for example gel 59, filling inside the casing 58.

For packaging semiconductor modules, two methods are generally employed. In one of the two methods, semiconductor chips 55 and solder plates 54a before melting are positioned using an assembly jig 500, which can be a carbon jig, and soldered to a packaging substrate 53, as shown in FIGS. 16(a), 16(b) and 17(a), 17(b). In the other of the two methods, which is not depicted in the drawings, after printing solder paste on a packaging substrate 53 using a metal mask or the like, a semiconductor chip 55 is positioned and then soldered with the solder paste.

With the former method that uses an assembly jig 500, the assembly jig 500 must be designed in consideration of dimensions and scattering thereof of the semiconductor chip 55 and other parts, extent of distortion of the parts during the assembly process, and ease of assembly operation.

FIGS. 13(a), 13(b), 14(a), 14(b), 15(a) and 15(b) show construction of a conventional assembly jig for a semiconductor device, in which FIGS. 13(a) and 13(b) show a structure of an inner positioning piece, FIGS. 14(a) and 14(b) show a structure of an outer framework, and FIGS. 15(a) and 15(b) show construction of the whole assembly jig. Of these figures, FIGS. 13(a), 14(a), and 15(a) are plan views of essential parts, and FIGS. 13(b), 14(b), and 15(b) are sectional views taken along the lines X-X in FIGS. 13(a), 14(a), and 15(a), respectively.

Referring to FIGS. 13(a) and 13(b), an inner positioning piece 61 is composed of a flat plate 62 having openings 63. Semiconductor chips 55 and solder plates 54a, which are shown in FIG. 17(b), are inserted into the openings 63. A positioning piece here is a jig that is positioned by a frame at the outer periphery of the positioning piece and has an opening(s) (or a window(s)) inside the positioning piece for receiving and positioning a part(s), which may be a smaller positioning piece(s) or a semiconductor chip(s).

Referring to FIGS. 14(a) and 14(b), an outer framework 66 is composed of a frame 67 and metal pins 68. Disposed inside the inner surface side face 69 of the frame 67 are an inner positioning piece 61 and a packaging substrate 53 as shown in FIGS. 16(b) and 17(b). The metal pin 68 is inserted into a positioning hole 51a of a cooling base 51 to position the outer framework 66 on the cooling base 51 as shown in FIGS. 16(a), 16(b), 17(a), and 17(b).

Referring to FIGS. 15(a) and 15(b), the whole assembly jig 500 is composed of the inner positioning piece 61 and the outer framework 66.

FIGS. 16(a) and 16(b) show a construction with the assembly jig 500, the solder plate 52a, and the packaging substrate 53 positioned on the cooling base 51. The outer framework 66 is positioned and fixed on the cooling base 51 by the metal pins 68 inserted into the positioning holes 51a. The solder plate 52a and the packaging substrate 53 are put on the cooling base 51 and positioned by the metal pins 68, which are components of the outer framework 66. The inner positioning jig 61 is positioned by the inside wall surface 69 of the frame 67 composing the outer framework 66 and mounted on the packaging substrate 53.

FIGS. 17(a) and 17(b) show a construction with the packaging substrate 53, the assembly jig 500, and semiconductor chips 55 mounted on the cooling base 51, in which FIG. 17(a) is a plan view and FIG. 17(b) is a sectional view taken along the line X-X in FIG. 17(a). FIGS. 17(a) and 17(b) show the construction in which the solder plates 54a and the semiconductor chips 55 are inserted into the openings 63 of the inner positioning piece 61 shown in FIGS. 16(a) and 16(b) and positioned and mounted on the packaging substrate 53.

In the soldering step, the whole assembly shown in FIGS. 17(a) and 17(b) are put into a heating furnace (not shown in the drawings) and soldered in a reducing atmosphere at a high temperature without using flux, the whole assembly including the cooling base 51, the packaging substrate 53, the assembly jig 500, and the semiconductor chips 55. The packaging jig 500 is made from a material that does not contaminate the heating furnace, hardly deforms so as not to cause damages of cracks or the like in the mounted semiconductor chips and solder plates that become in contact with the packaging jig, and further is readily machined. Thus, carbon is generally used for the material of the assembly jig 500.

Japanese Unexamined Patent Application Publication No. 2007-194477 (also referred to herein as "Patent Document 1") discloses a positioning jig comprising a first jig and a second jig, the latter being analogous to the inner positioning piece mentioned above. The first jig has a positioning hole (i.e., an opening) into which a solder sheet (i.e., a solder plate) and a semiconductor element (i.e., a semiconductor chip) are inserted. The positioning hole is disposed corresponding to a metal circuit (i.e., a conductive pattern) on a circuit board (i.e., a packaging substrate). The second jig is possible to be inserted into and removed from the positioning hole. The second jig has a pressing surface that opposes the metal circuit in the state of the second jig inserted into the positioning hole and presses the semiconductor element put on the solder sheet towards the circuit board. The second jig is positioned by the wall surface of the positioning hole so that the pressing surface opposes the metal circuit in the state of the second jig inserted into the positioning hole. The document asserts that such a construction well solders the semiconductor element to the joint place and forms a good solder fillet.

The purpose of the assembly jig in this document is to improve formation of a solder fillet. Fillet formation is assisted by making the jig directly in contact with the semiconductor chip and pressing the semiconductor chip. In order to obtain a good fillet configuration, the jig is made from stainless steel and heats the jig itself.

Japanese Unexamined Patent Application Publication No. 2008-270262 (also referred to herein as "Patent Document 2") discloses a positioning jig in which a planar body, which is analogous to the inner positioning jig mentioned above, has protrusions protruding from the lower surface of the planar body toward an insulation substrate at places close to the outer periphery thereof by creating steps in the lower surface of the planar body within a range including a part of a positioning hole. Since the protrusions provided on the lower surface of the planar body touch or approach the upper surface of the insulation substrate close to the outer periphery thereof when the positioning jig is put on the insulation substrate convex upward, a solder foil and a heating element in the positioning hole are so disposed that movement in the positioning hole is restricted by the protrusions and thus, the solder foil and the heating element are mounted at a predetermined position. The document asserts that such a construction allows a semiconductor element to be mounted at a predetermined position on a curved insulation substrate without shifting the element.

In order to cope with the shift of the chip, the construction of this document comprises the parts analogous to the inner positioning piece and the outer framework, and in consideration of distortion of the packaging substrate protruding toward upper or front surface side of the packaging substrate due to heat in the soldering process, the inner positioning piece is cut in the central region thereof to absorb the protruding distortion of the packaging substrate.

Japanese Unexamined Patent Application Publication No. 2010-040881 (also referred to herein as "Patent Document 3") discloses a positioning construction in which a carbon jig for positioning (i.e., an inner positioning piece) is disposed on the front surface side of an insulating circuit board and, a solder plate and a semiconductor chip are placed in the opening of the carbon jig. Then, the whole assembly is put into a heating furnace and heated up to a temperature higher than the melting point of the solder for example, about 300° C. to melt the solder. Thus, the semiconductor chip is mounted on the insulating circuit board. While the insulating circuit board is temporarily distorted in a configuration protruding toward rear surface side when heated, since the carbon jig has a stepped portion on the rear surface side so as to make the carbon jig thinner toward the direction separating from the opening, the degree of close attachment between the carbon jig and the insulating circuit board is enhanced, according to the assertion of the document.

The construction described in the document, in consideration of distortion of the packaging substrate, concaved in the front surface side thereof due to heat in the soldering process, has an inner positioning piece cut in the peripheral region thereof to absorb the concave distortion of the packaging substrate.

With the progress of performance improvement in semiconductor chips, reduction of size and thickness of a semiconductor chip has been recently in progress. The thickness of semiconductor chips has been reduced down to about 100 µm.

FIG. 18 shows a packaging substrate 53 curved at a temperature in the soldering process. The packaging substrate 53 curves due to thermal stress in the assembling process. This curved configuration creates a gap S between the packaging substrate surface 53a and the rear surface 61a (i.e., the rear surface of a flat plate 62) of the inner positioning piece 61 that is one of the components of the assembly jig. If the gap S becomes larger than a dimension T5 that is the sum of the thickness of the semiconductor chip 55 with an advanced thickness reduction and the thickness of the melted solder 54b, which is nearly equal to a thickness of the solder plate 54a, the semiconductor chip 55 should slip aside in this gap S, which causes difficulty in accurate positioning of the semiconductor chip.

The Patent Documents 1, 2, and 3 all do not disclose such a means for preventing the semiconductor chip from slipping aside in the gap that provides one chip-positioning piece for every one semiconductor chip and makes the gap between the assembly jig (i.e., the bottom surface of the chip positioning piece) and the thermally distorted packaging substrate surface be smaller than the sum of the thickness of the semiconductor chip and the thickness of the solder disposed under the semiconductor chip.

Further, in the construction disclosed in Patent Document 3, when the curvature of the concaved packaging substrate surface becomes large, the inner positioning piece in the document leaves the very large gap failing to absorb the large concaved curvature. Thus, the semiconductor chip slips aside in the gap. Accordingly, there are presently certain needs in the art.

SUMMARY OF THE INVENTION

Embodiments of the present invention address these and other needs. Embodiments of the invention provide an assembly jig for a semiconductor device and an assembly method for a semiconductor device in which the dimension of the gap between the assembly jig and the packaging substrate surface is made smaller than the sum of the thickness of the semiconductor chip and the thickness of the solder in the process of soldering the semiconductor chip to the packaging substrate.

Embodiments of the invention include an outer framework for positioning a packaging substrate, the outer framework being positioned and mounted on a cooling base, an inner positioning piece in a shape of a flat plate positioned by the outer framework and mounted on the packaging substrate, and a chip positioning piece(s) positioned by an opening(s) formed in the inner positioning piece and allowed to move in the vertical direction relative to and independently of the inner positioning piece. Also, A length of the chip positioning piece passing through the opening in the inner positioning piece is larger than a thickness of the inner positioning piece.

In some embodiments, the length of the chip positioning piece passing through the opening in the inner positioning piece is at least a dimension that allows a part of a bottom surface of the chip positioning piece to become in contact with an upper surface of the packaging substrate curved in an amount estimated at elevated temperatures to which the packaging substrate is subjected.

In some embodiments, the chip positioning piece includes a pipe portion passing through the opening of the inner positioning piece and a flange portion on the pipe portion, and a length of the pipe portion is at least a dimension that allows a part of a bottom surface of the chip positioning piece to become in contact with an upper surface of the packaging substrate curved in an amount estimated at elevated temperatures to which the packaging substrate is subjected.

In some embodiments, the outer framework, the inner positioning piece, and the chip positioning piece are formed from carbon.

In some embodiments, a method of assembling a semiconductor device can include steps of positioning and mounting an outer framework on a cooling base, mounting a first solder plate on the cooling base inside the outer framework and a packaging substrate on the first solder plate by positioning with the outer framework, mounting an inner positioning piece on the packaging substrate by positioning with the outer framework, inserting a pipe portion of a chip positioning piece into an opening of the inner positioning piece and positioning the chip positioning piece by making a part of a bottom surface of the pipe portion of the chip positioning piece become in contact with the packaging substrate, and inserting a second solder plate and a semiconductor chip laminated in this order into an opening of the chip positioning piece to position the second solder plate and the semiconductor chip. The method can also include putting a whole assembly into a heating furnace and melting the first solder plate and the second solder plate while making a part of the bottom surface of the pipe portion of the chip positioning piece be in contact with the packaging substrate that is curved due to thermal stress, the whole assembly including the cooling base, the packaging substrate, the first and second solder plates, the semiconductor chip, and an assembly jig that includes the outer framework, the inner positioning piece, and the chip positioning piece; solidifying the first solder plate and the second solder plate which have been melted, to fix the packaging substrate onto the cooling base and fix the semiconductor chip onto the packaging substrate and extracting the whole assembly from the heating furnace and removing the assembly jig from the cooling base.

In some embodiments, a length of the pipe portion of the chip positioning piece is at least a dimension that allows a part of the bottom surface of the pipe portion of the chip positioning piece to become in contact with an upper surface of the packaging substrate curved at temperatures to melt the first and second solder plates.

In some embodiments, the inner positioning piece and the chip positioning piece are so constructed that a part of the bottom surface of the pipe portion of the chip positioning piece is allowed to be always in contact with the surface of the packaging substrate following curved distortion of the packaging substrate at temperatures to melt the first and second solder plates.

In some embodiments, when the packaging substrate is curved concaving upward at temperatures of melting the solder, the gap between the assembly jig and the packaging substrate can be made smaller than the dimension of the sum of the thickness of the semiconductor chip and the thickness of the melted solder by allowing a part of the bottom surface of the chip positioning piece to become always in contact with the upper surface of the packaging substrate owing to the weight of the chip positioning jig itself. As a consequence, in some embodiments, the semiconductor chip does not slip aside out of the opening of the chip positioning piece. Therefore, the semiconductor chip can be positioned accurately on the packaging substrate.

BRIEF DESCRIPTION OF DRAWINGS

FIG. 1b is a sectional view taken along the line X-X in FIG. 1a;

FIG. 2b is a sectional view taken along the line X-X in FIG. 2a;

FIG. 3b is a sectional view taken along the line X-X in FIG. 3a;

FIG. 4a is a plan view of the whole assembly jig for a semiconductor device of the first embodiment of the invention, and FIG. 4b is a sectional view taken along the line X-X in FIG. 4a;

FIGS. 5(a) and 5(b) show a configuration of the assembly jig with a solder plate and a packaging substrate positioned on a cooling base, in which FIG. 5(a) is a plan view and FIG. 5(b) is a sectional view taken along the line X-X in FIG. 5a;

DETAILED DESCRIPTION

In the process of positioning and soldering a semiconductor chip on a packaging substrate using an assembly jig, the packaging substrate typically curves at a certain temperature in the soldering process. Embodiments of the invention prevent a semiconductor chip with a reduced thickness from a positional shift by making a dimension of the gap between the assembly jig and the surface of the packaging substrate be smaller than the sum of the thickness of the semiconductor chip and the thickness of the melted solder irrespective of a quantity of the distortion.

Example 1

Figure 1A:
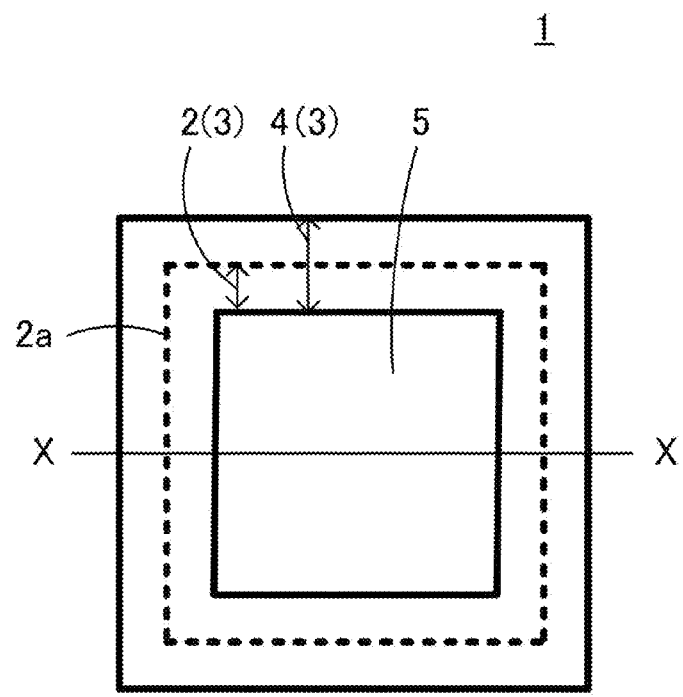
FIG. 1a is a plan view of a chip positioning piece composing an assembly jig for a semiconductor device of a first embodiment of the invention.
Figure 1B:
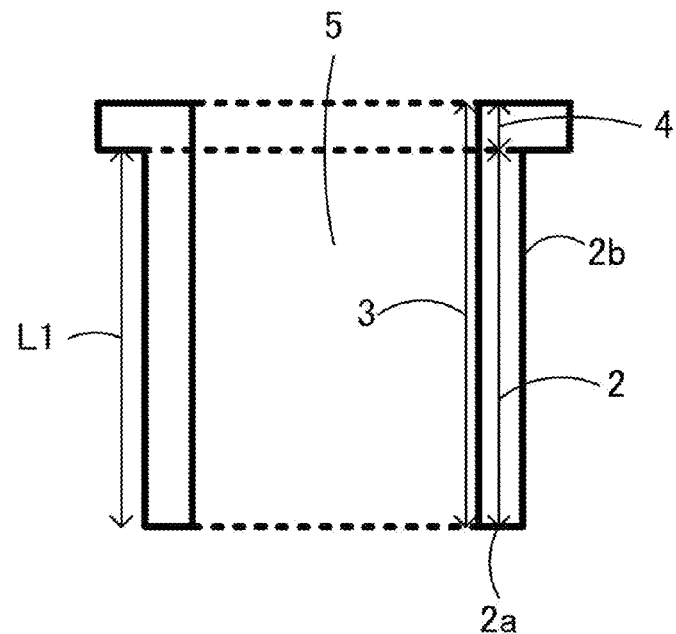
Figure 2A:
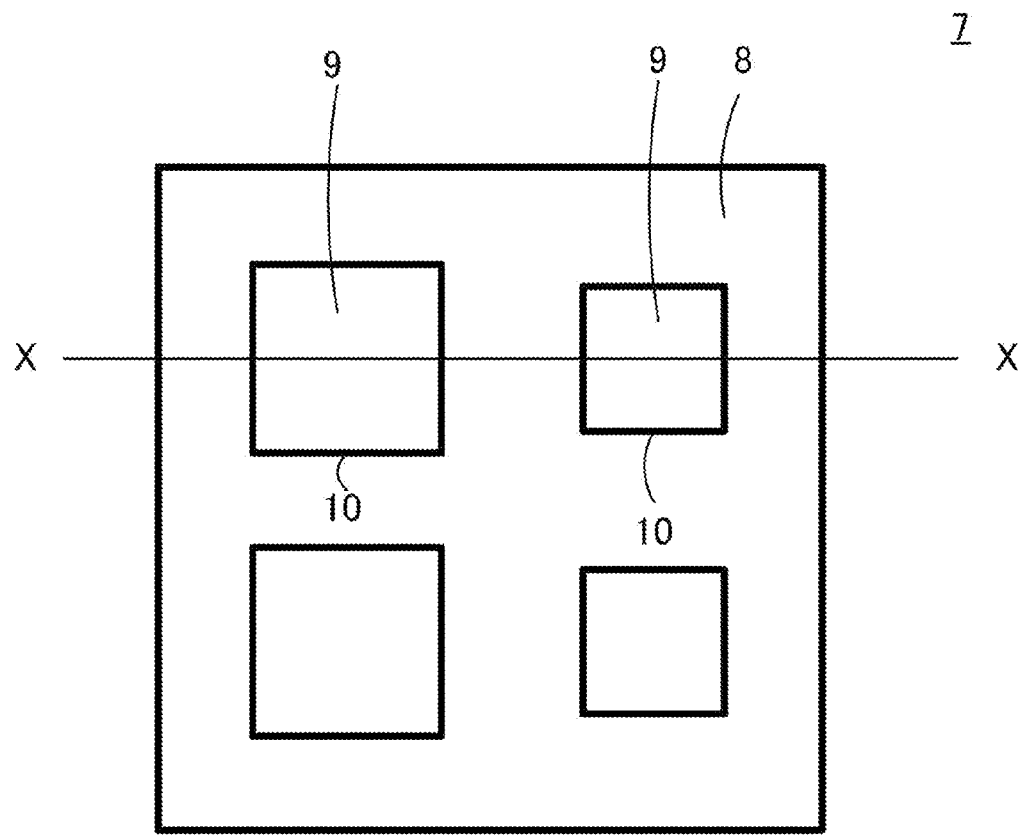
FIG. 2a is a plan view of an inner positioning piece composing an assembly jig for a semiconductor device of the first embodiment of the invention.
Figure 2B:
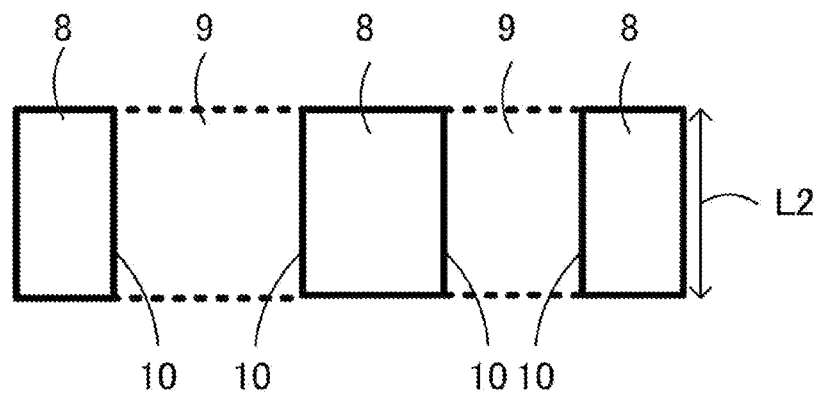
Figure 3A:
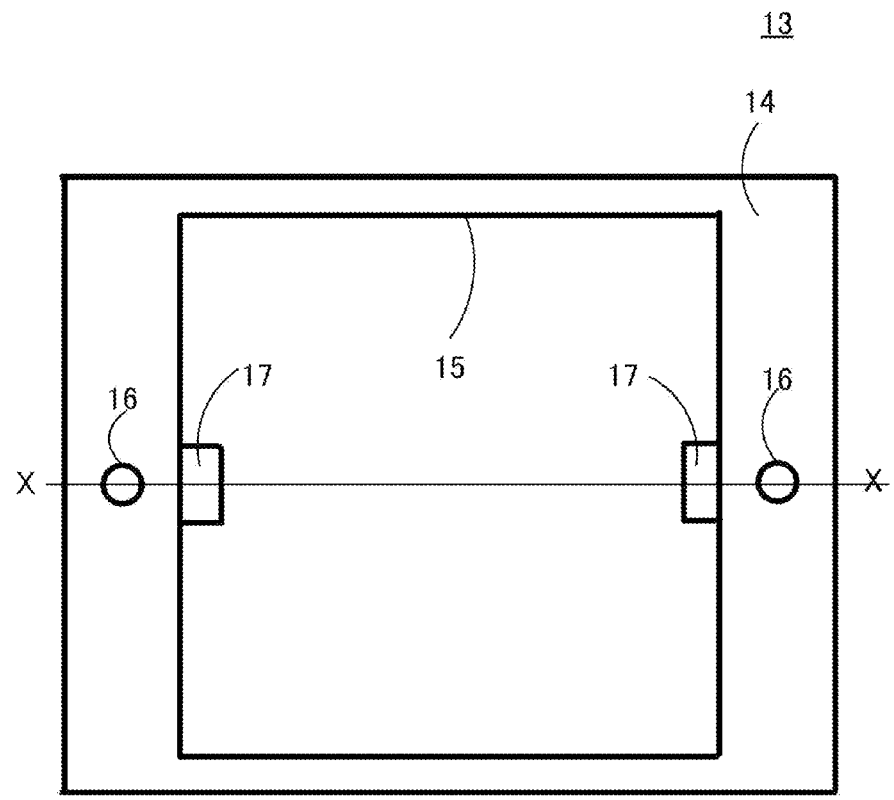
FIG. 3a is a plan view of an outer framework composing an assembly jig for a semiconductor device of the first embodiment of the invention.
Figure 3B:
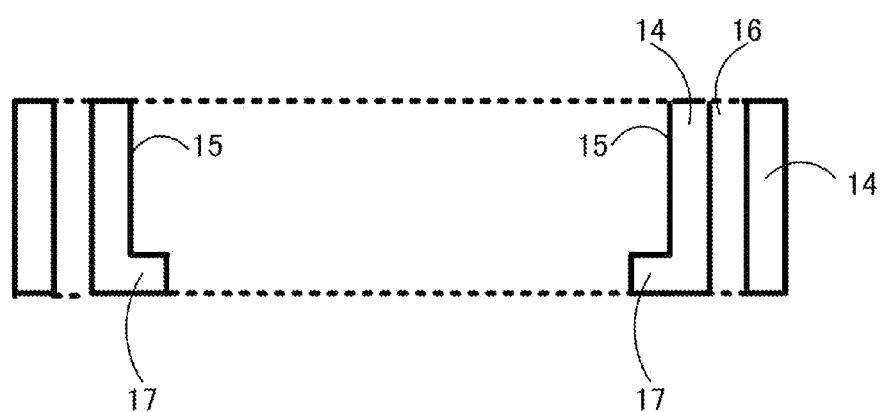
Figure 4:
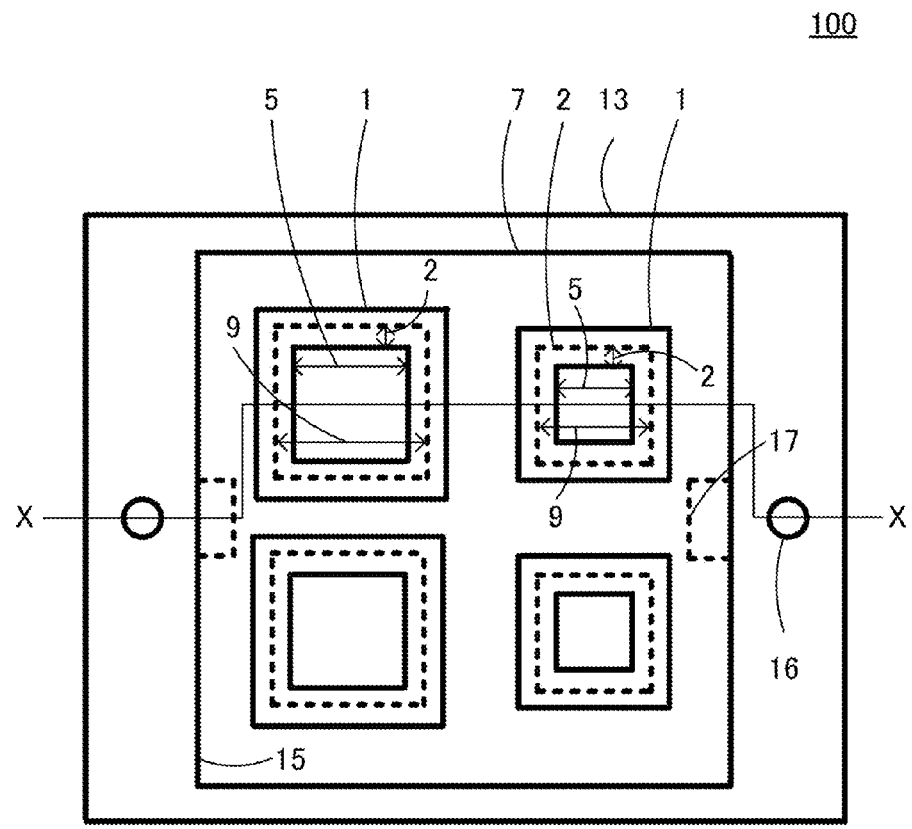
Figure 4:
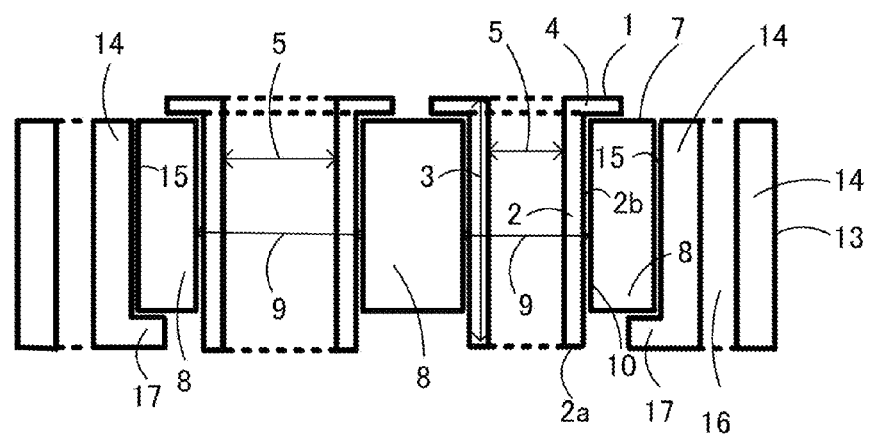

FIGS. 1(a), 1(b) through 4(a), 4(b) show a construction of an assembly jig for a semiconductor device of a first embodiment example according to embodiments of the present invention, in which FIGS. 1(a) and 1(b) show a structure of a chip positioning piece, FIGS. 2(a) and 2(b) show a structure of an inner positioning piece, FIGS. 3(a) and 3(b) show a structure of an outer framework, and FIGS. 4(a) and 4(b) show a construction of whole of the assembly jig. Of these drawings, FIGS. 1(a), 2(a), 3(a), and 4(a) are plan views and FIGS. 1(b), 2(b), 3(b), and 4(b) are sectional views taken along the line X-X in the respective plan views.

Referring first to FIGS. 1(a) and 1(b), the chip positioning piece 1 is composed of a pipe portion 2 and a flange portion 4 formed at the top of the pipe portion 2. The chip positioning piece 1 is provided with an opening 5 having a square shape in a top plan view and has four side surfaces 3 around the opening 5. The flange portion 4 is provided for the purpose of preventing the chip positioning piece 1 from dropping through an opening 9 in an inner positioning piece 7 when the chip positioning piece 1 is inserted into the opening 9. A gap of about 0.05 mm is formed between the outer wall surface of the pipe portion of the chip positioning piece 1, which is an outer wall surface of the chip positioning piece 1, and an inner wall surface 10 of the opening 9 in the inner positioning piece 7. Thus, the chip positioning piece 1 can freely and independently move in the vertical direction with respect to the inner positioning piece 7.

If two adjacent chip positioning pieces are formed in a configuration of direct contact with each other (this case is not shown in the drawings), a flange portion is not formed at this contact side and the outer wall surface of the pipe portion 2 is extended up to the top of the flange portion 4 forming an outer side surface 3 of the chip positioning piece 1. In this case, a gap of about 0.05 mm is provided between the outer side surface of the two adjacent chip positioning pieces 1 allowing easy relative slip motion.

The length L1 of the pipe portion 2 of the chip positioning piece 1, the pipe portion 2 being disposed through the opening 9 in the inner positioning piece 7, is larger than the thickness L2 of the inner positioning piece 7. Preferably, the length L1 of the pipe portion 2 is long enough to allow the bottom of the pipe portion 2 to become in contact with a packaging substrate 21 (which is not depicted in FIGS. 1(a) through 4(b) but illustrated in FIG. 11) curved at a temperature in the soldering process as described afterward.

In the configuration in which a part of the bottom surface 2a of the pipe portion 2 of the chip positioning piece 1 is always in contact with the packaging substrate 21, the dimension T1 of the gap between the bottom surface 2a of the pipe portion 2 of the chip positioning piece 1 is smaller than the dimension T2 of the sum of the thickness W1 of the semiconductor chip 31 and the length W2a of the melted solder (which is approximately equal to the thickness W2 of the solder plate). Therefore, a positional shift of the semiconductor chip 31 does not occur.

In order to ensure the chip positioning piece 1 to become in contact with the packaging substrate 21 by the weight of the chip positioning piece itself, the weight of the chip positioning piece 1 is sufficiently increased by increasing the thickness of the flange portion 4, for example. The flange portion 4 can be eliminated from the chip positioning piece 1, if desired.

In the example described above, the opening 5 of the chip positioning piece 1 has a shape of square in the top plan view and the opening 5 is surrounded by four surfaces of a monolithic side wall 3. The four surfaces, however, can be formed by combining four separated flat plates, or forming two or three continuous surfaces by a monolithic body with two or three walls and the other necessary surfaces by a side wall(s) of other chip positioning piece.

Figure 5:
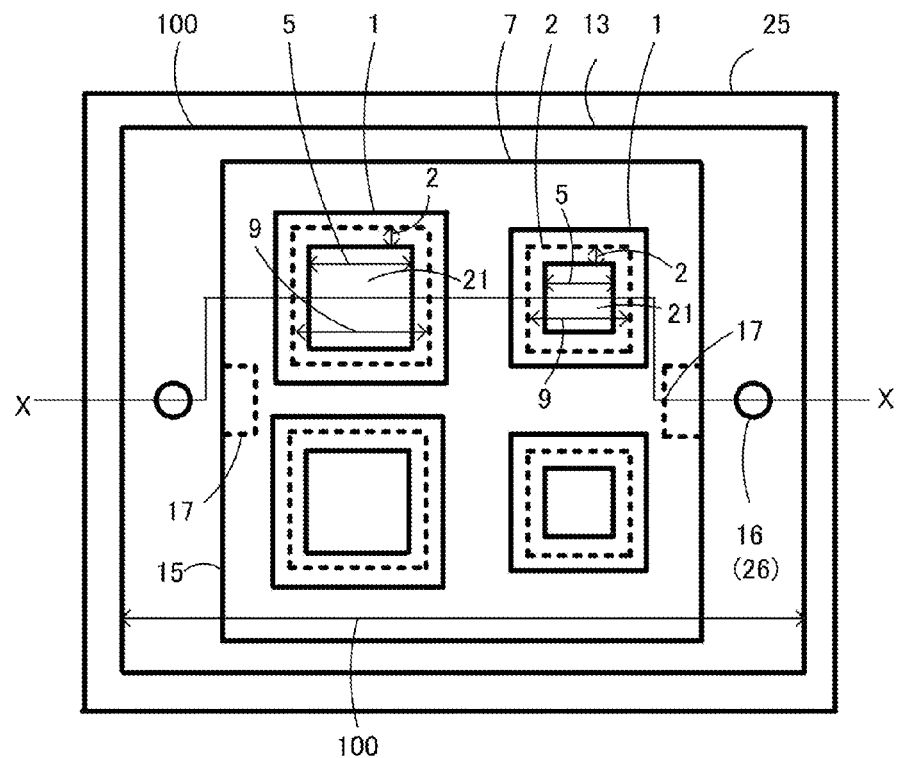
Figure 5:
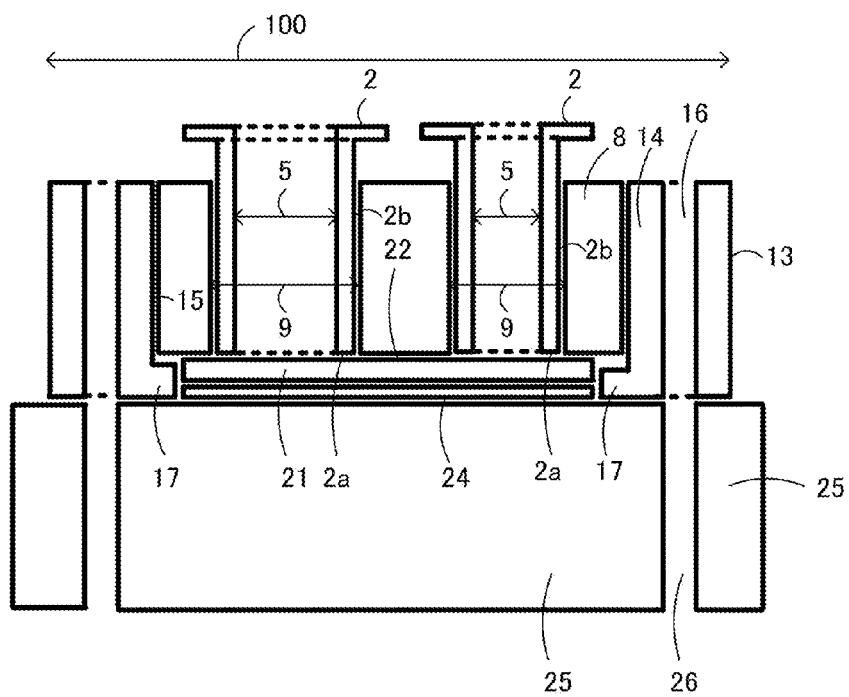

The inner positioning piece 7 is a flat plate 8 having openings 9 as shown in FIGS. 2(a) and 2(b). The flat plate 8 of the inner positioning piece 7 is positioned by an outer framework 13 on a cooling base and a packaging substrate (for sake of clarity, these parts are not shown in FIGS. 1(a) through 4(b), but are illustrated in FIG. 5). In the opening 9 of the inner positioning piece 7, the pipe portion 2 of the chip positioning piece 1 is inserted. In this example, the openings 9 of the inner positioning piece 7 are prepared corresponding to one chip positioning piece 1 for one opening 9. The opening 9, however, can have such a large planar area that allows two or more chip positioning pieces 1 to be inserted in one enlarged opening.

Figure 16:
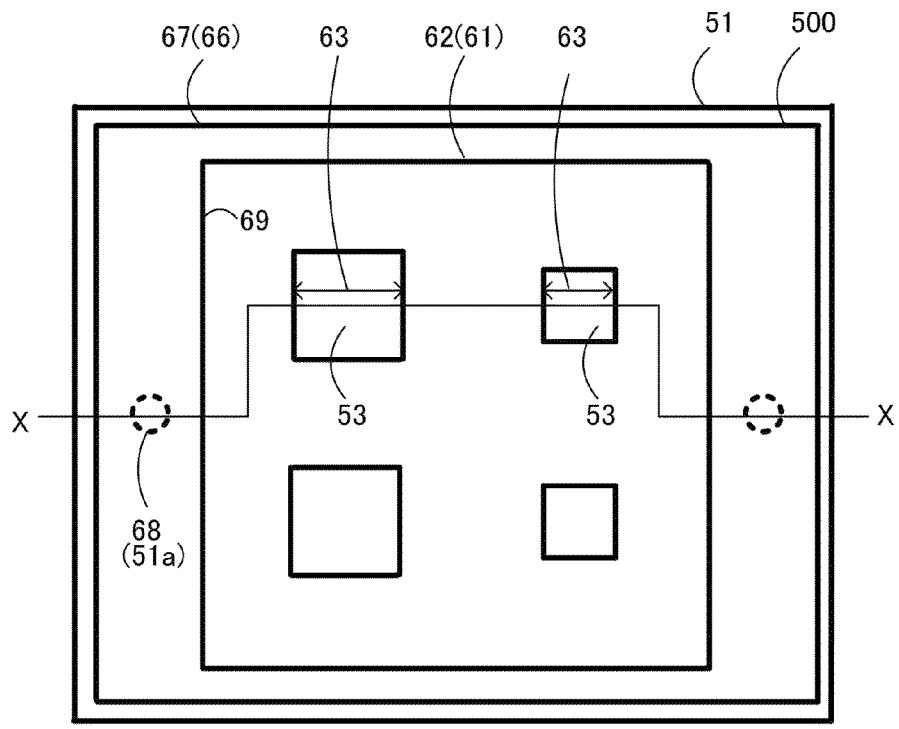
FIG. 16(a) is a plan view showing a construction with an assembly jig, a solder plate, and a packaging substrate positioned on a cooling base.
FIG. 16(b) is a sectional view taken along the line X-X in FIG. 16(a)
Figure 16:
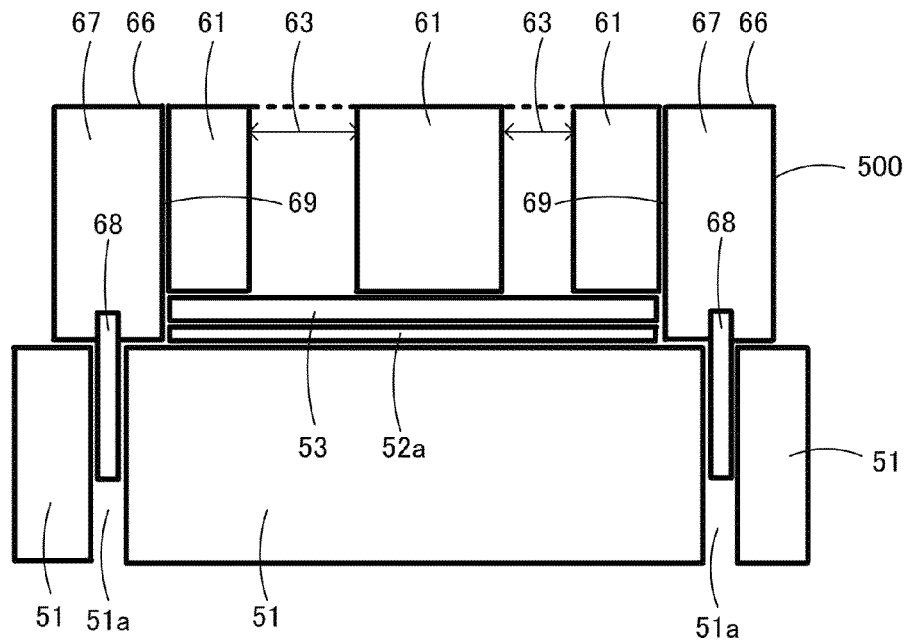
Figure 17A:
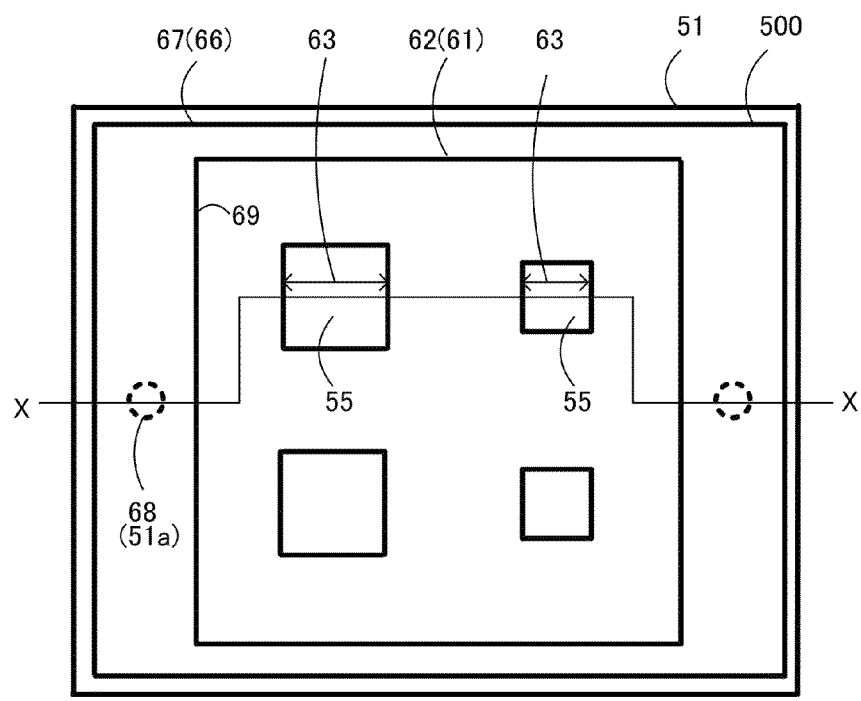
FIG. 17(a) is a plan view showing a construction with a packaging substrate, an assembly jig, and semiconductor chips mounted on a cooling base.
Figure 17:
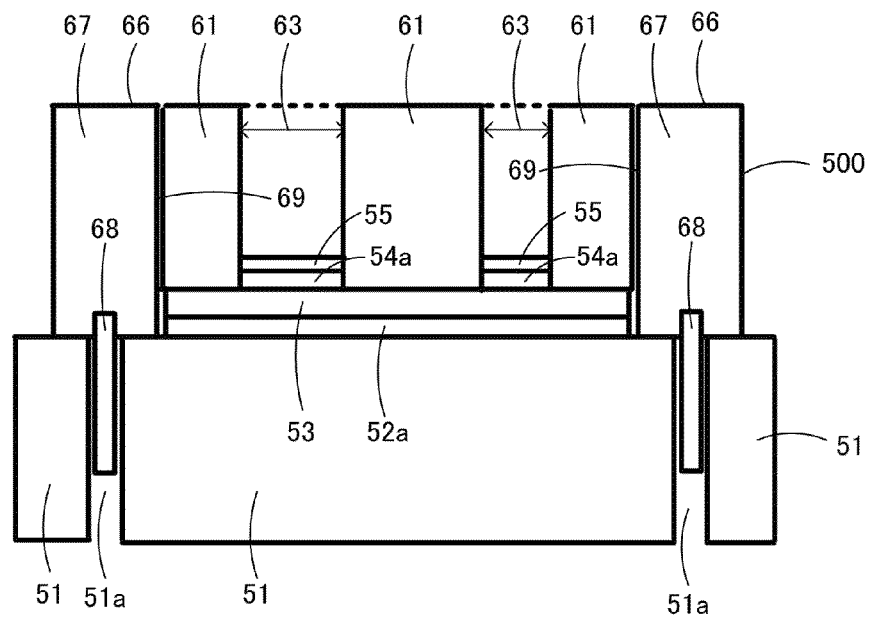
FIG. 17(b) is a sectional view taken along the line X-X in FIG. 17(a)
Figure 18:
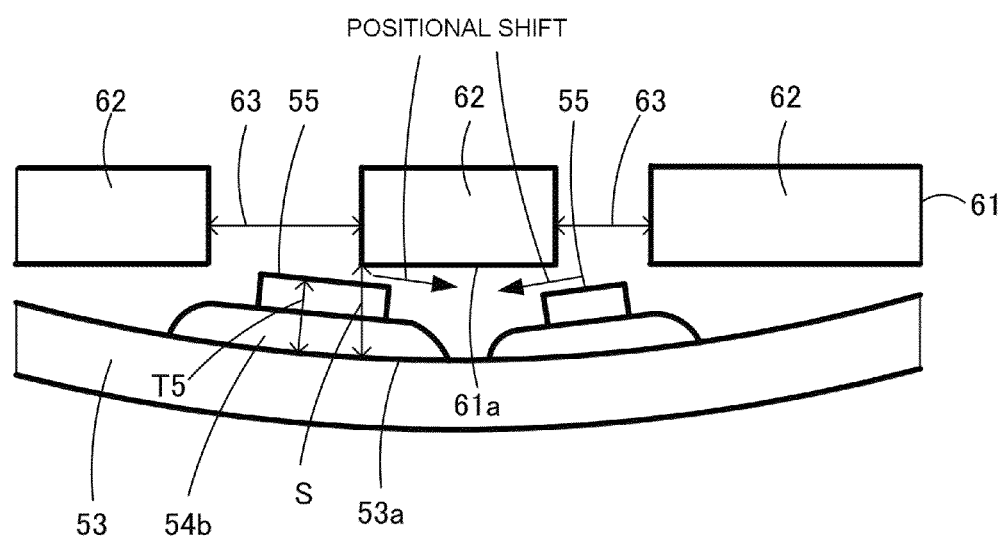
FIG. 18 shows a configuration with a packaging substrate distorted at a temperature in the soldering process.

The outer framework 13 is composed of a frame 14 for positioning the inner positioning piece 7 and a tab 17 for positioning the packaging substrate 21 as shown in FIGS. 3(a) and 3(b). In end regions of the frame 14, positioning holes 16 are formed. A cooling base 25, a component of the semiconductor module, is also provided with positioning holes 26 in the end regions thereof as shown in FIGS. 5(a) and 5(b). By fitting the holes 16 to the holes 26, the outer framework 13 is positioned and fixed to the cooling base 25 using bolts and nuts (not depicted in the drawings), for example. Alternatively, the frame 14 can be provided with positioning metal pins analogous to the metal pins 68 in FIG. 16 instead of the positioning holes 16 formed in the end region of the frame 14. The metal pins are inserted into the positioning holes 26 in the cooling base 25 to position the outer framework 13 on the cooling base 25.

When the tabs are absent in the outer framework 13, the packaging substrate 21 and the inner positioning piece 7 are positioned using the inner wall surface 15 of the outer framework 13.

FIGS. 4(a) and 4(b) show construction of the whole of the assembly jig. The assembly jig 100 is composed of the outer framework 13, the inner positioning piece 7 positioned by the inner wall surface 15 of the frame 14 of the outer framework 13, and the chip positioning pieces 1 positioned by the openings 9 of the inner positioning piece 7. When a soldering step in the process of assembling a semiconductor device is conducted in a reducing atmosphere and at high temperatures without using flux, the assembling jig 100 is preferably made from carbon which does not contaminate the heating furnace (without attacking property), little deforms thermally, scarcely damages the touching parts including the semiconductor chip 31 by cracking or other destructive phenomenon, and is readily machined.

FIGS. 5(a) and 5(b) show a configuration in which the solder plate 24, the packaging substrate 21, and the assembly jig 100 are positioned on the cooling base 25. The solder plate 24 is put on the cooling base 25 and then the packaging substrate 21 is put on the solder plate 24, the packaging substrate 21 being positioned by the tab 17 of the outer framework 13 which composes the assembly jig 100. The chip positioning pieces 1 are put on the packaging substrate 21 and positioned by the inner positioning piece 7 which composes the assembling jig 100. The cooling base 25 and the outer framework 13 can be positioned relatively to each other for example, using metal pins as in a conventional construction.

The packaging substrate 21 is distorted with the upper surface thereof concaved upward when heated to temperatures at which the first solder plate 24 and the second solder plate 32 beneath the semiconductor chip 31 melt. (The second solder plate 32 and the semiconductor chip 31 are not shown in FIGS. 5(a) and 5(b) but shown in FIG. 8.) In the construction of embodiment, the chip positioning piece 1 is allowed to move freely and independently in the vertical direction with respect to the inner positioning piece 7, and the length L1 of the chip positioning piece 1 is adequately larger than the thickness L2 of the inner protruding piece 7. As a consequence, a part of the bottom surface 2a of the pipe portion 2 of the chip positioning piece 1 can be always in contact with the upper surface 22 of the packaging substrate 21 owing to the weight of the chip positioning piece 1 itself even when the packaging substrate is concaved upward.

The whole of the assembly jig 100 can be removed from the cooling base 25 by removing and lifting the outer framework 13 from the cooling base 25, which in turn raises the inner positioning piece 7 by the tab 17 of the outer framework 13, thereby picking up the chip positioning piece 1 by the periphery of the opening 9 of the inner positioning piece 7 which becomes in contact with the flange portion 4 of the chip positioning piece 1. Thus, whole the assembly jig 100 is removed altogether at once.

When the tab 17 of the outer framework 13 and the flange portion 4 of the chip positioning piece 1 are not provided, the outer framework 13 and the chip positioning piece 1 are individually lifted and removed from the cooling base 25.

Figure 11:
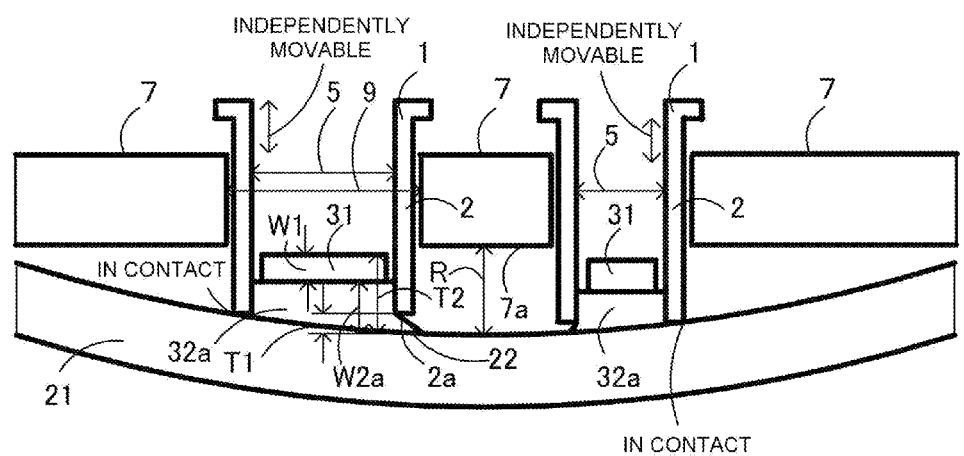
FIG. 11 is an enlarged sectional view showing a state with the solder plate in the step of FIG. 9 melted.
Figure 12:
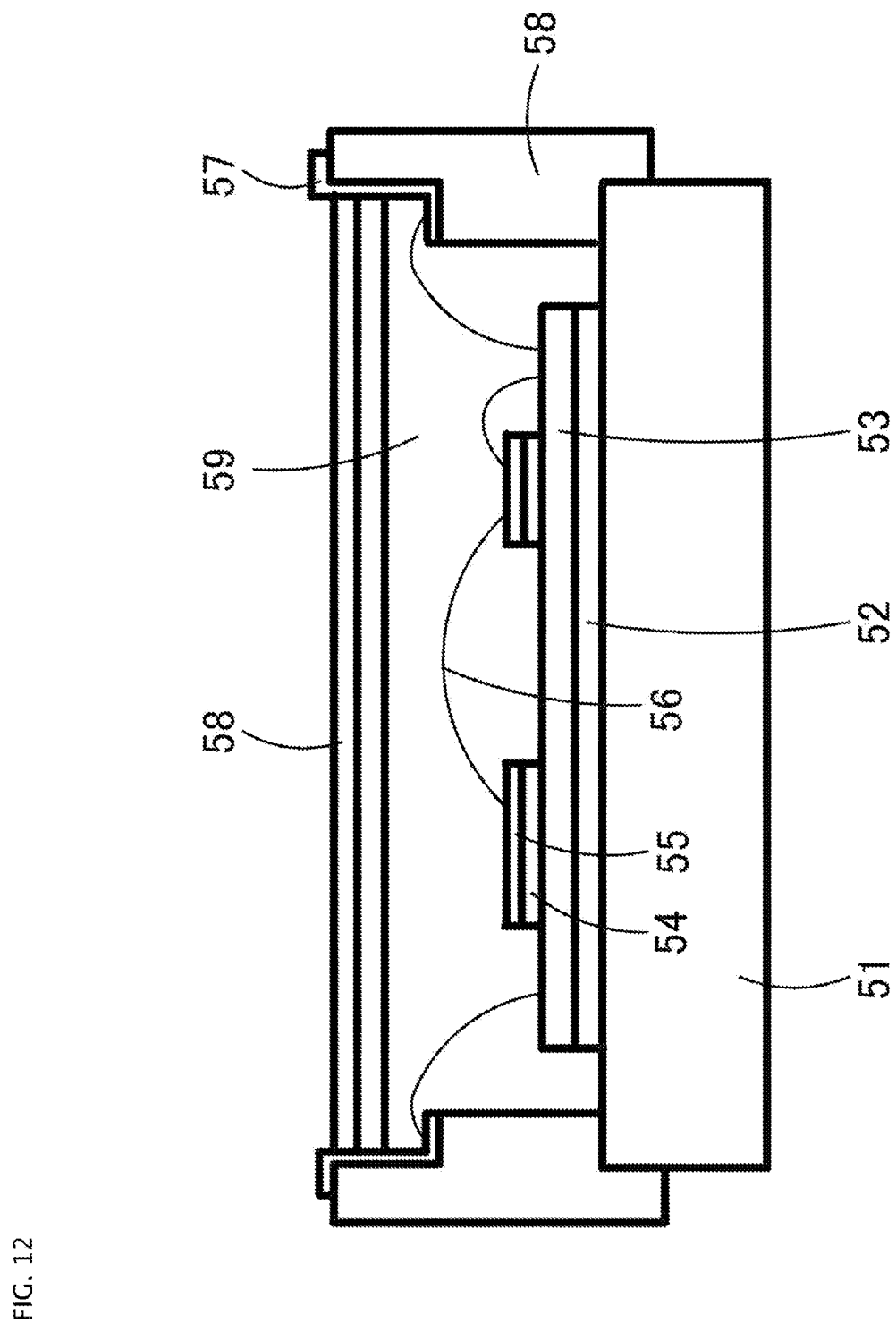
FIG. 12 is a schematic sectional view of a semiconductor module.
Figure 13:
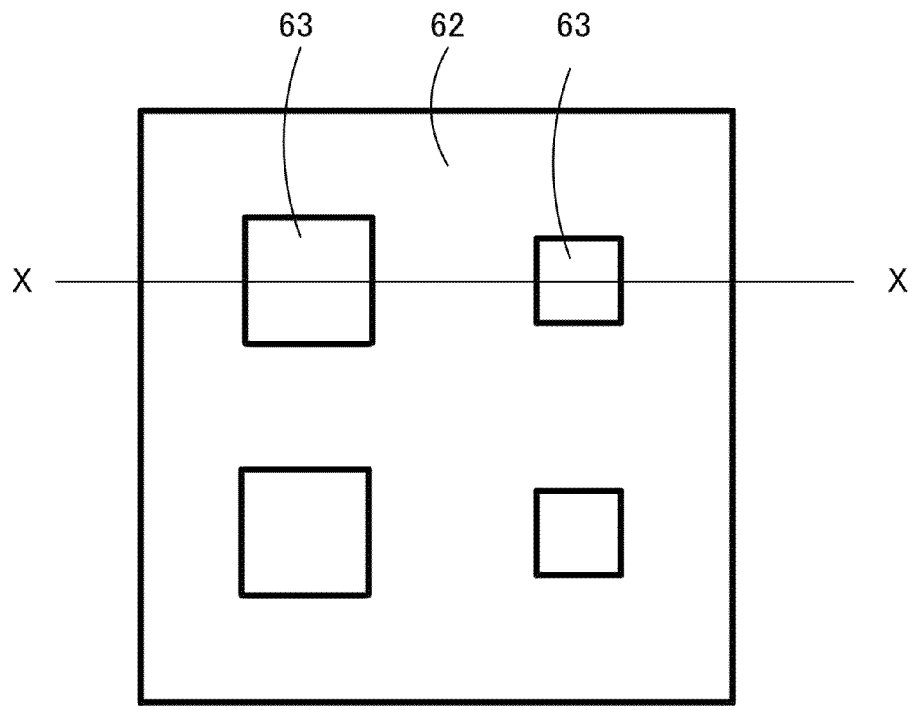
FIG. 13(a) is a plan view of an inner positioning piece composing a conventional assembly jig for a semiconductor device.
FIG. 13(b) is a sectional view taken along the line X-X in FIG. 13(a)
Figure 13:
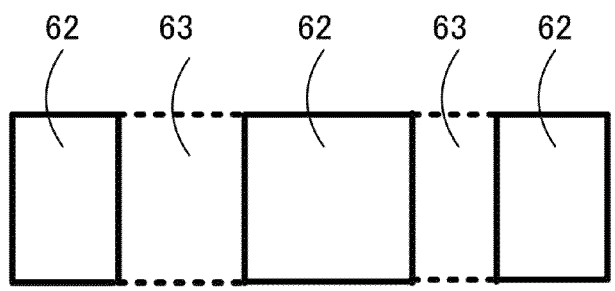
Figure 14:
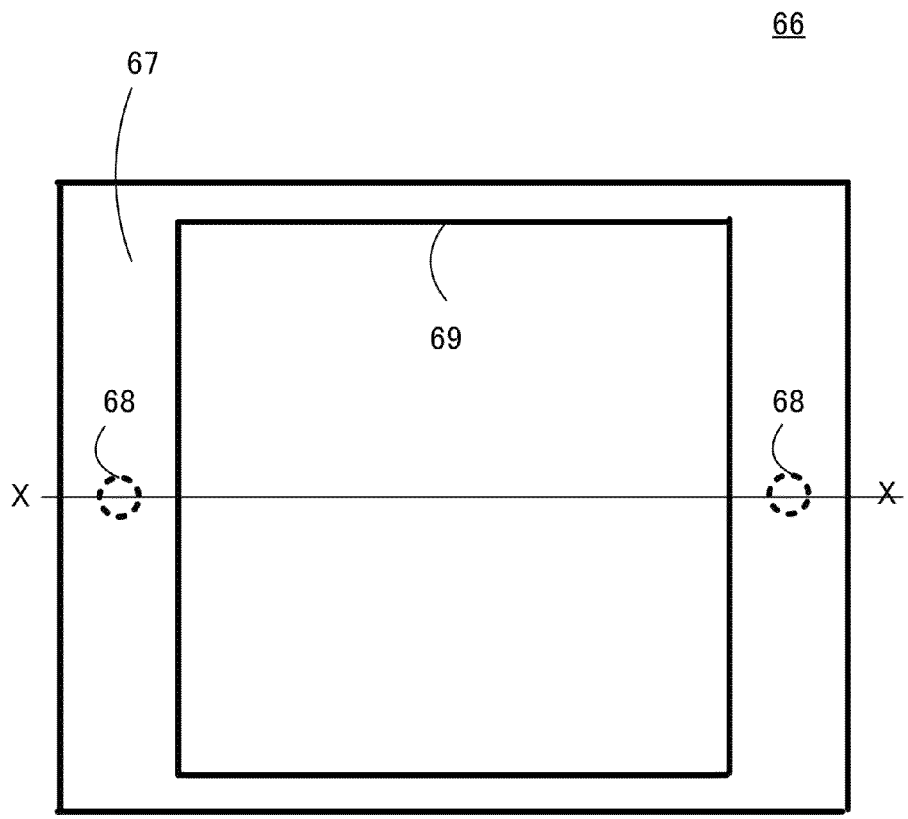
FIG. 14(a) is a plan view of an outer framework composing a conventional assembly jig for a semiconductor device.
FIG. 14(b) is a sectional view taken along the line X-X in FIG. 14(a)
Figure 14:
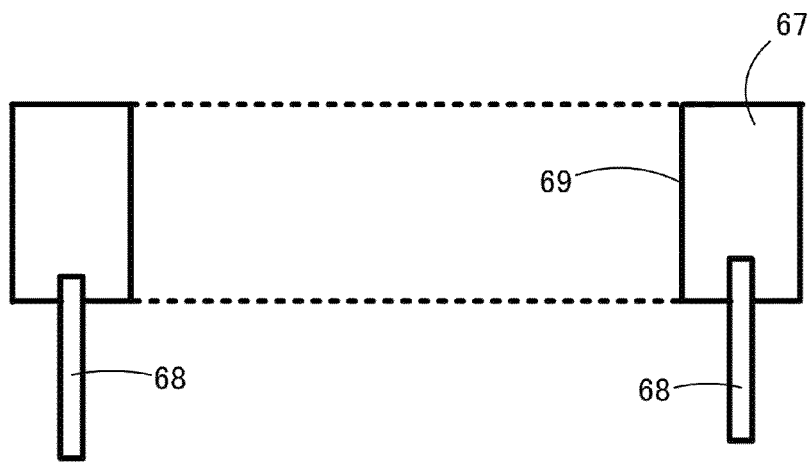
Figure 15:
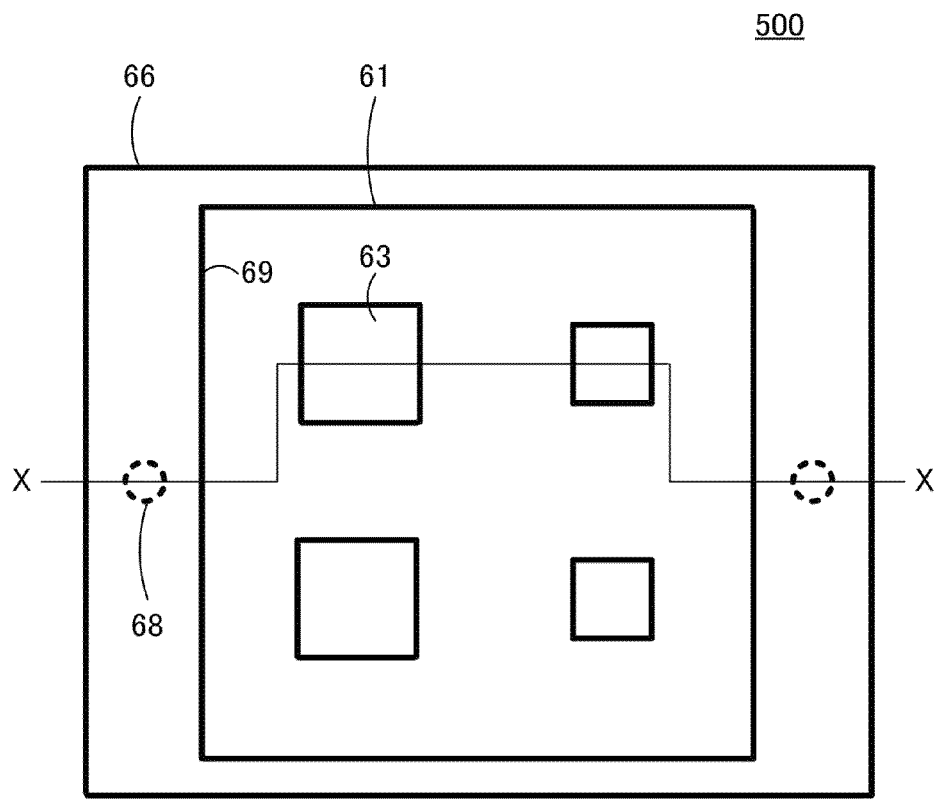
FIG. 15(a) is a plan view of whole of the conventional assembly jig for a semiconductor device.
FIG. 15(b) is a sectional view taken along the line X-X in FIG. 15(a)
Figure 15:
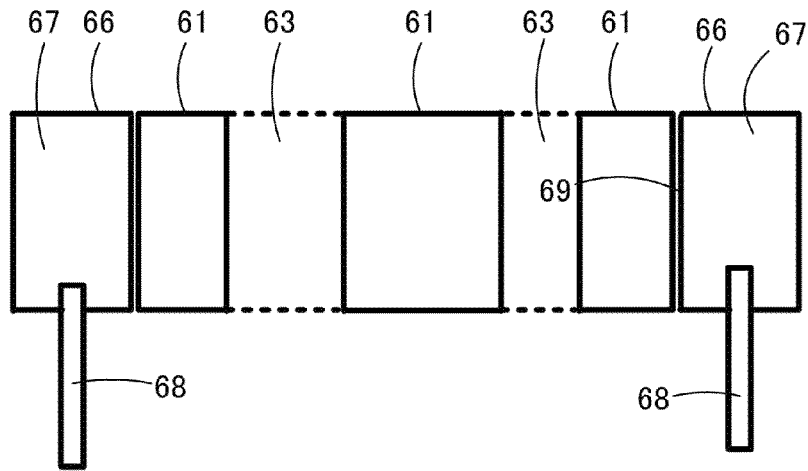

In the situation of FIG. 11 in the soldering process, the gap T1 between the bottom surface 2a of the pipe portion of the chip positioning piece 1 and the upper surface 22 of the packaging substrate 21 can be made smaller than the dimension T2 of the sum of the thickness W1 of the semiconductor chip 31 and the thickness W2a of the melted solder 32a beneath the semiconductor chip 31, the thickness W2a being approximately equal to the thickness W2 of the solder plate 32. Consequently, the semiconductor chip 31 does not shift laterally when the solder plate 32 melts to the melted solder 32a, to avoid slipping out from the opening 5 of the chip positioning piece 1. Therefore, the semiconductor chip 31 is positioned on the packaging substrate 21 with high accuracy.

Example 2

FIGS. 6 through 10 are sectional views showing an assembly method for a semiconductor device of a second example of embodiment according to the present invention in the sequence of steps in the assembly method.

Figure 6:
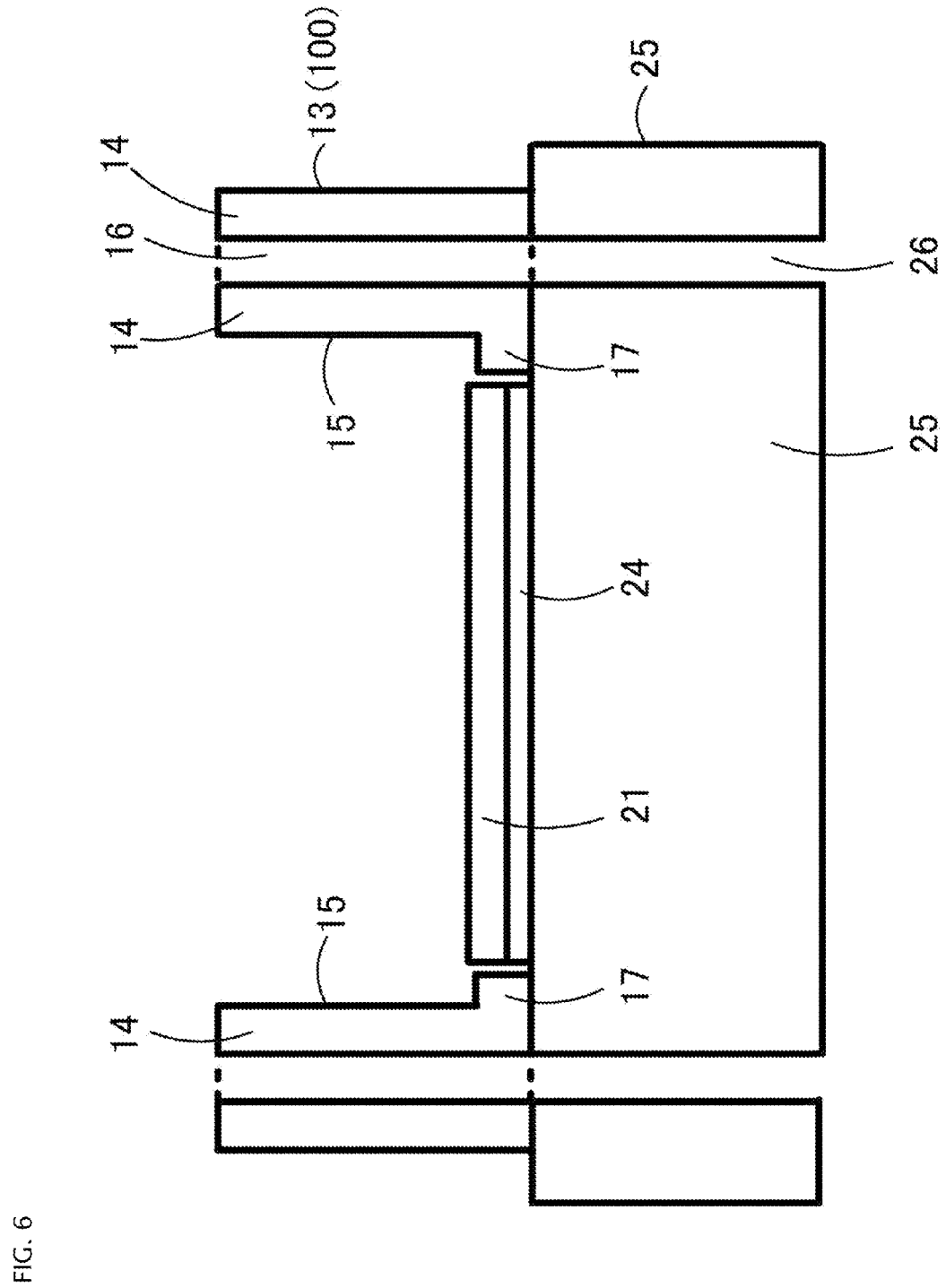
FIG. 6 is a simplified sectional view showing a step of an assembly method for a semiconductor device of a second embodiment according to embodiments of the invention.

Referring first to FIG. 6, the outer framework 13 is put and positioned on the cooling base 25. Then, the first solder plate 24 and the packaging substrate 21 on the solder plate 24 are put and positioned by reference of the tab 17 (a protrusion) of the outer framework 13.

Figure 7:
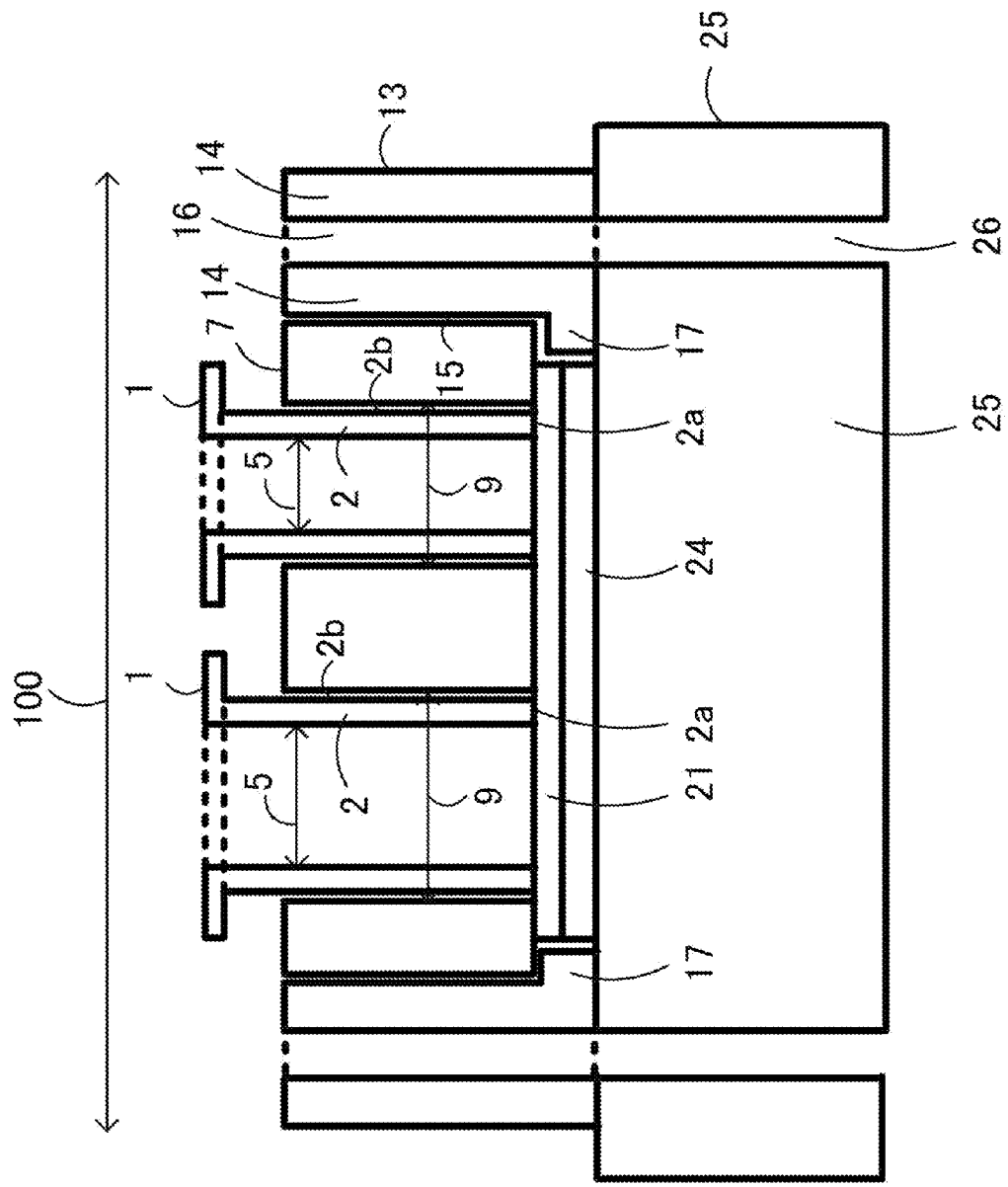
FIG. 7 is a simplified sectional view showing a step following the step of FIG. 6 of the assembly method for a semiconductor device of the second embodiment according to embodiments of the invention.

Then referring to FIG. 7, the inner positioning piece 7 is positioned and mounted on the packaging substrate 21 by reference of the inner wall surface 15 of the frame 14 of the outer framework 13. Subsequently, the chip positioning piece 1 is positioned and placed by inserting the pipe portion 2 of the chip positioning piece 1 into the opening 9 of the inner positioning piece 7.

Figure 8:
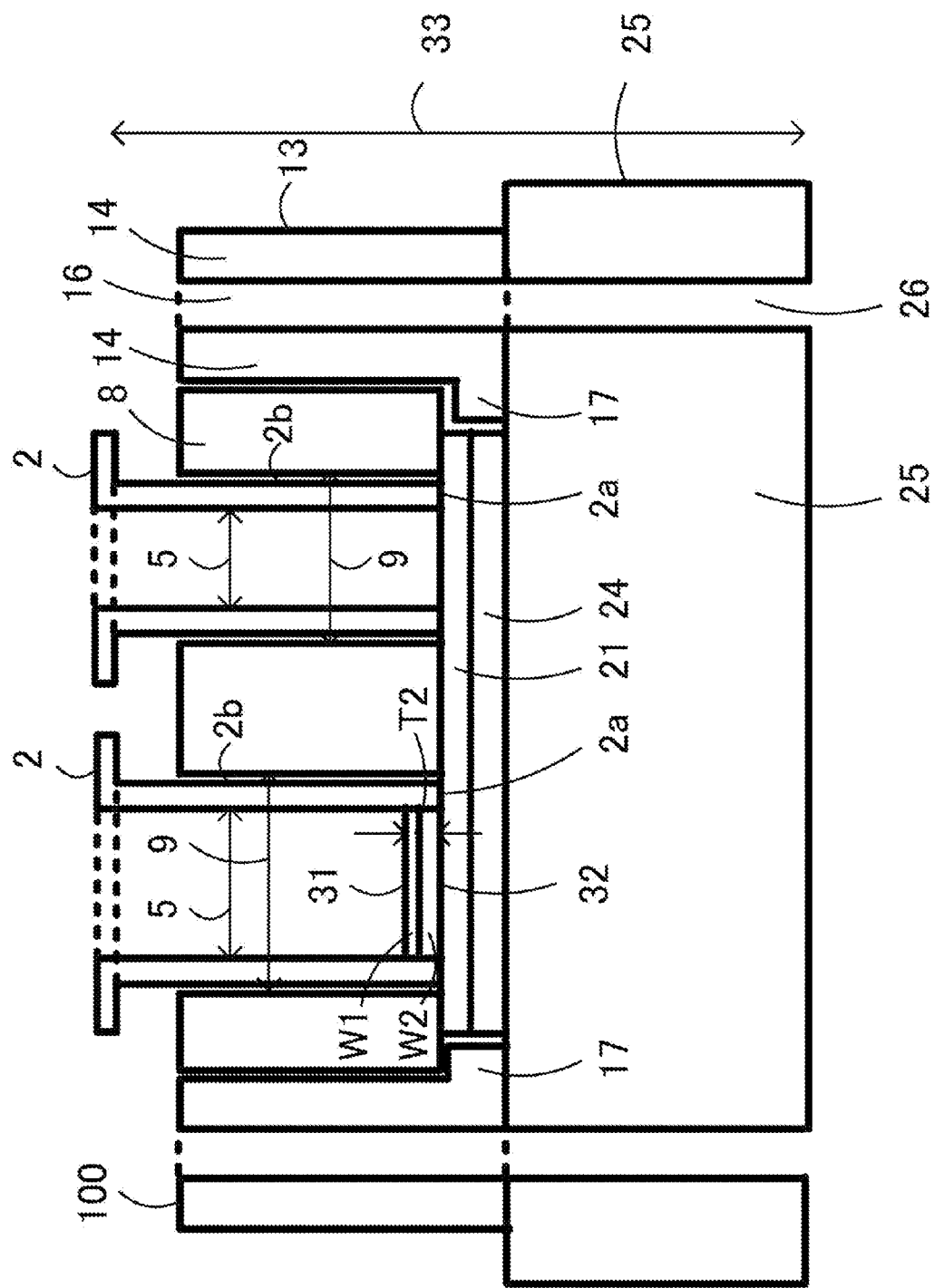
FIG. 8 is a simplified sectional view showing a step following the step of FIG. 7 of the assembly method for a semiconductor device of the second embodiment according to embodiments of invention.

Then referring to FIG. 8, the second solder plate 32 and the semiconductor chip 31 on the second solder plate 32 are positioned and mounted on the packaging substrate 21 by inserting into the opening 5 of the chip positioning piece 1.

Figure 9:
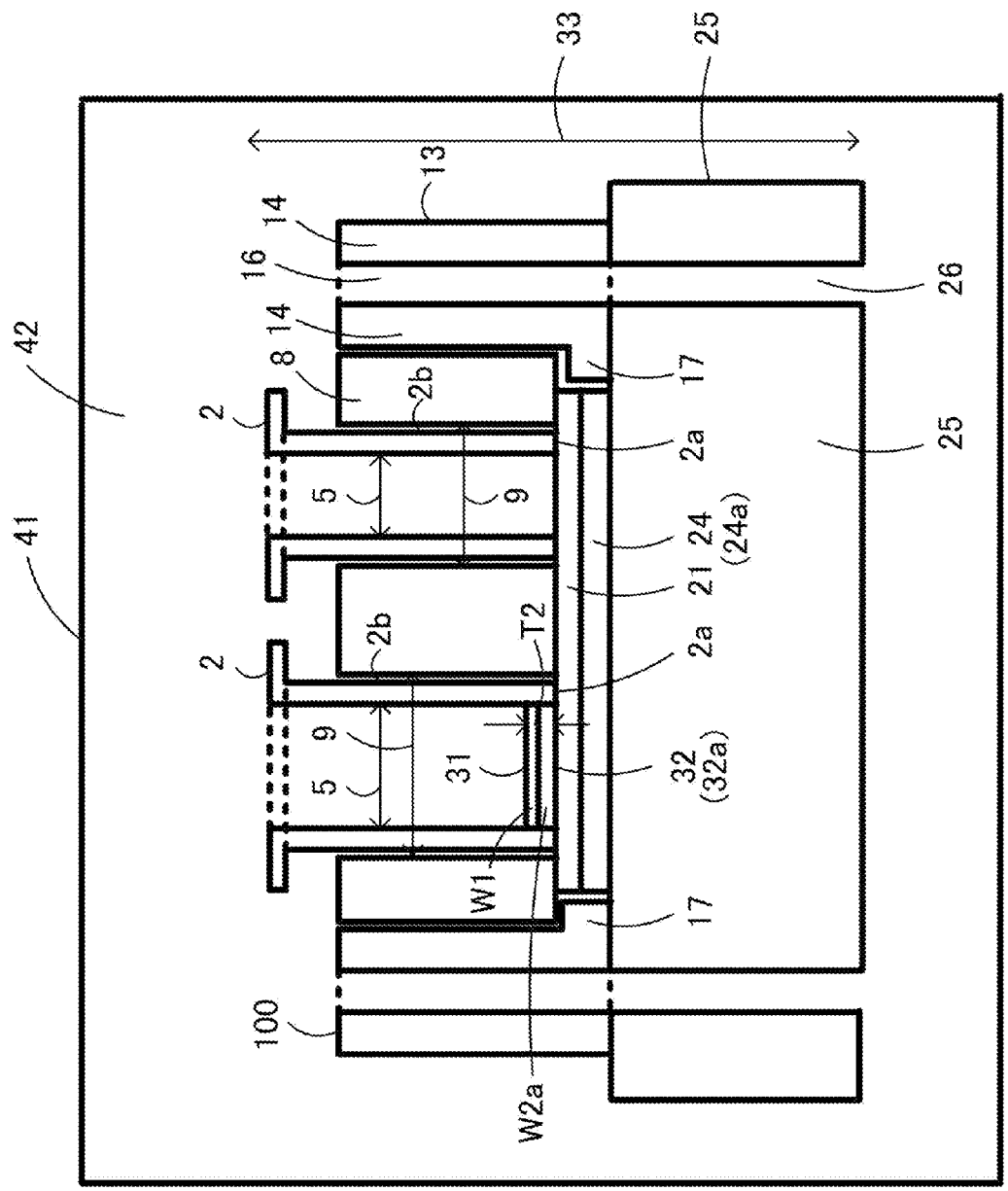
FIG. 9 is a simplified sectional view showing a step following the step of FIG. 8 of the assembly method for a semiconductor device of the second embodiment according to embodiments of invention.

Then referring to FIG. 9, the whole assembly is put into a heating furnace 41, the whole assembly including the semiconductor chip 31, the second solder plate 32, the chip positioning piece 1, the inner positioning piece 7, the outer framework 13, the packaging substrate 21, the first solder plate 24, and the cooling base 25 mounting all the parts listed above. The whole assembly in the heating furnace 41 is heated in a reducing atmosphere 42 at a temperature of about 300° C. to melt the first and second solder plates 24 and 32 transforming the solder plates into melted solders 24a and 32a.

Figure 10:
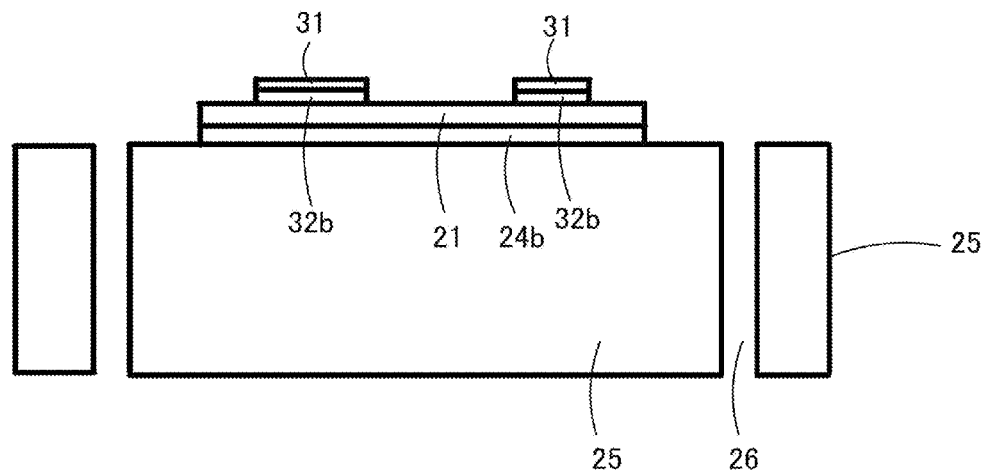
FIG. 10 is a simplified sectional view showing a step following the step of FIG. 9 of the assembly method for a semiconductor device of the second embodiment according to embodiments of invention.

Then, the melted solders 24a and 32a are solidified by cooling in the heating furnace 41 to fix the packaging substrate 21 onto the cooling base 25 and fix the semiconductor chip 31 onto the packaging substrate 21 with the solidified solders 24b and 32b, respectively. After that, the whole assembly including the assembly jig 100, the cooling base 25, the packaging substrate 21, the solidified solders 24b and 32b, and the semiconductor chip 31 is extracted from the heating furnace 41, and the assembly jig 100 is removed from the cooling base 25 as shown in FIG. 10. Thus, the soldering process is completed to fix the packaging substrate 21 onto the cooling base 25 and fix the semiconductor chip 31 onto the packaging substrate 21.

FIG. 11 is an enlarged sectional view showing the state in the step illustrated in FIG. 9 with melted solders. Referring to FIG. 11, the surface 22 of the packaging substrate 21 is concaved upward at the temperature of the soldering process. This concaving distortion creates a gap R between the bottom surface 7a of the inner positioning piece 7 and the upper surface 22 of the packaging substrate 21. However, in the positioning jig of the invention, the chip positioning piece 1 inserted in the opening 9 of the inner positioning piece 7 is not fixed but allowed to move freely and independently in the vertical direction in the inner positioning piece 7. Consequently, a part of the bottom surface 2a of the pipe portion 2 of the chip positioning piece 1 is always in contact with the upper surface 22 of the packaging substrate 21 following the distortion of the packaging substrate 21. The gap T1 between the bottom surface 2a of the pipe portion 2 of the chip positioning piece 1 and the upper surface 22 of the packaging substrate 21 is very small in this situation. Therefore, the semiconductor chip 31 does not slip aside from the opening 5 of the chip positioning piece 1 and a lateral positional shift of the semiconductor chip 31 does not occur.

This situation is described more in detail in the following. With increase in the temperature, the packaging substrate 21 becomes more curved, to increase the gap R between the inner positioning piece 7 and the upper surface 22 of the packaging substrate 21. The gap R would be as large as about 500 μm.

In the construction of the invention, however, the chip positioning jig 1 is always allowed to become contact with the upper surface 22 of the packaging substrate 21 owing to the weight of the chip positioning jig itself independently of the inner positioning piece 7 at a part of the chip positioning jig 1. Consequently, the gap T1 between the bottom surface 2a of the pipe portion 22 of the chip positioning piece 1 and the upper surface 2 of the packaging substrate 21 can be made small for example less than about 50 μm for a semiconductor chip 31 of about 10 mm square.

On the other hand, for a semiconductor chip 31 with a thickness W1 of 100 μm and a solder plate with a thickness W2 of 100 μm, for example, the gap of about 200 μm is permitted between the upper surface 22 of the packaging substrate 21 and the bottom surface 2a of the pipe portion 2 of the chip positioning piece 1. Hence, a large margin in the gap of 150 μm=200 μm−50 μm can be obtained, in which the dimension 200 μm is the allowable gap and the dimension 50 μm is the largest presumable gap T1 in these conditions.

Since the length L1 of the chip positioning piece 1 is larger than the thickness L2 of the inner positioning piece 7 in an amount greater than the gap R between the inner positioning piece 7 and the upper surface 22 of the packaging substrate 21, a part of the bottom surface 2a of the pipe portion 2 of the chip positioning piece 1 is always in contact with the upper surface 22 of the packaging substrate 21. Therefore, a lateral positional shift of the semiconductor chip 31 is avoided and positioning accuracy of the chip is improved.

The curving distortion of the packaging substrate 21 occurs caused by the difference between the thermal expansion coefficients of an insulation substrate and conductive materials of a conductive pattern and a conductive film on the insulation substrate. (The insulation substrate and the conductive materials are not shown in the drawings.) The conductive film is formed on the back surfaced of the insulation substrate and the conductive pattern is formed on the front surface of the insulation substrate. The conductive film on the back surface is not formed in a conductive pattern but formed as a uniform single sheet on the whole back surface. The conduction pattern on the front surface, on the other hand, is composed of a plurality of circuit patterns. Hence, the area of the conductive film on the back surface is larger than that of the conductive pattern on the front surface. As a consequence, the packaging substrate 21 distorts with a concaved front surface, which is the upper surface, when the thermal expansion coefficient of the conductive material is larger than that of the insulation substrate at elevated temperatures.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-024611, filed on Feb. 8, 2011. The disclosure of the priority application, in its entirety, including the drawings, claims, and the specification thereof, is incorporated herein by reference.

What is claimed is:

1. An assembly jig for a semiconductor device comprising:
    an outer framework for positioning a packaging substrate, the outer framework being positioned and mounted on a cooling base;
    an inner positioning piece, in a shape of a flat plate, positioned by the outer framework and mounted on the packaging substrate; and
    a chip positioning piece(s) positioned by an opening(s) formed in the inner positioning piece and allowed to move in the vertical direction relative to and independently of the inner positioning piece;
    wherein a length of the chip positioning piece passing through the opening in the inner positioning piece is larger than a thickness of the inner positioning piece.

2. The assembly jig for a semiconductor device according to claim 1, wherein the length of the chip positioning piece passing through the opening in the inner positioning piece is at least a dimension that allows a part of a bottom surface of the chip positioning piece to become in contact with an upper surface of the packaging substrate that subsequently becomes curved due to being subjected to elevated temperatures.

3. The assembly jig for a semiconductor device according to claim 1, wherein the chip positioning piece comprises a pipe portion passing through the opening of the inner positioning piece and a flange portion on the pipe portion, and a length of the pipe portion is at least a dimension that allows a part of a bottom surface of the chip positioning piece to become in contact with an upper surface of the packaging substrate that subsequently becomes curved due to being subjected to elevated temperatures.

4. The assembly jig for a semiconductor device according to claim 2, wherein the chip positioning piece comprises a pipe portion passing through the opening of the inner positioning piece and a flange portion on the pipe portion, and a length of the pipe portion is at least a dimension that allows a part of a bottom surface of the chip positioning piece to become in contact with an upper surface of the packaging substrate that subsequently becomes curved due to being subjected to elevated temperatures.

5. The assembly jig for a semiconductor device according to claim 1, wherein the outer framework, the inner positioning piece, and the chip positioning piece are formed from carbon.

* * * * *